US 6,549,550 B2

(12) United States Patent
Dautartas et al.

(10) Patent No.: US 6,549,550 B2
(45) Date of Patent: Apr. 15, 2003

(54) METHOD FOR REDUCING THERMAL LOSS AND PROVIDING MECHANICAL COMPLIANCE IN A SEMICONDUCTOR PACKAGE AND THE SEMICONDUCTOR PACKAGE FORMED THEREFROM

(75) Inventors: Mindaugas F. Dautartas, Blacksburg, VA (US); Joseph M. Freund, Fogelsville, PA (US); John M. Geary, Macungie, PA (US); George J. Pryzbylek, Douglasville, PA (US)

(73) Assignee: TriQuint Technology Holding Co., Hillsboro, OR (US)

( * ) Notice: Subject to any disclaimer, the term of this patent is extended or adjusted under 35 U.S.C. 154(b) by 0 days.

(21) Appl. No.: 09/781,995

(22) Filed: Feb. 14, 2001

(65) Prior Publication Data

US 2002/0110163 A1 Aug. 15, 2002

(51) Int. Cl.⁷ ............................... H01S 3/04; H01S 5/00
(52) U.S. Cl. ............................................. 372/36; 372/43
(58) Field of Search ....................... 385/88, 93; 372/36, 372/43, 34

(56) References Cited

U.S. PATENT DOCUMENTS

| 5,703,893 A | * | 12/1997 | Komiyama et al. ............ 372/43 |
| 5,881,193 A | * | 3/1999 | Anigbo et al. ................. 385/93 |
| 6,055,815 A | | 5/2000 | Peterson |
| 6,106,161 A | * | 8/2000 | Balavanhally ............... 385/88 |

* cited by examiner

*Primary Examiner*—Quyen Leung
(74) *Attorney, Agent, or Firm*—Dickstein Shapiro Morin & Oshinsky LLP

(57) ABSTRACT

Flexible ground connectors are adapted to withstand temperature-induced stresses. The connectors may be formed of low thermal conductivity materials. The connectors may be used within a semiconductor package that also encloses a thermoelectric cooling device, a conductive submount, and a semiconductor light source. The submount may be grounded to the package wall by locating a pair of the flexible ground connectors across a gap to a ledge in the wall. The ground connectors may be formed of stainless steel, and they may be gold plated for improved electrical conductivity.

19 Claims, 3 Drawing Sheets

METHOD FOR REDUCING THERMAL LOSS AND PROVIDING MECHANICAL COMPLIANCE IN A SEMICONDUCTOR PACKAGE AND THE SEMICONDUCTOR PACKAGE FORMED THEREFROM

FIELD OF THE INVENTION

The invention generally relates to semiconductor packages, and more particularly to optoelectric semiconductor packages with greater mechanical compliance and reduced thermal loss at the ground connections.

BACKGROUND

Known optoelectric semiconductor packages typically include an optical subassembly which contains a laser chip and a conductive platform. The chip delivers an optical signal to a lens in the optical subassembly, and the signal is then launched from the lens into a high speed connector, such as a metallic wire or pin. The high speed connector leads from the platform to connect the chip with a semiconductor device that utilizes optical signals. Examples of known laser packages may be found in U.S. Pat. Nos. 6,106,161 (Basavanhally et al.) and 5,881,193 (Anigbo et al.). The chip is generally grounded through the platform to the package body. Typically, the ground connection is accomplished through a solder bridge or a conductive epoxy bridge.

The temperature at which the chip operates may be governed by a thermoelectric cooling (TEC) device, which serves to control and/or stabilize the wavelength of the light emitted by the chip. An example of the use of TEC devices in an optoelectric semiconductor package may be found in U.S. Pat. No. 6,055,815 (Peterson). The chip, conductive platform and TEC device may be located within a package. The package provides physical protection to the assembled components as well as attendant connectors.

As the TEC device heats and cools, thermal stresses are created and the ground connection between the conductive platform and the package body flexes due to differing thermal expansions of the relevant materials making up the conductive platform and the package body. Over time, the flexing of the ground connection, i.e., the solder or epoxy bridge, may cause the bridge to break.

SUMMARY

The invention provides a semiconductor package which includes a chip, a conductive support structure, a heat transfer device, and a package body having a cavity. The chip, conductive support structure and heat transfer device are positioned within the cavity. An optoelectric connector extends from the cavity out of the package body. At least one ground connector connects the conductive support structure with the package body. The ground connector is adapted to flex with thermal changes.

The invention also provides a method for reducing thermal loss through ground connections in an optoelectric semiconductor package. The method includes providing a chip and a conductive support structure within a cavity of a package body. The cavity may have a wall with a ledge. At least one ground connector may be positioned between the conductive support structure and the ledge. According to one aspect of the invention, the ground connector is formed of stainless steel foil.

According to another aspect of the invention, a semiconductor package having ground connectors is adapted to be compliant or flexible under thermal stress. The method includes providing a cavity including an interior wall spaced apart from a conductive support structure, and attaching at least one ground connector to the conductive support structure and the cavity interior wall. If desired, the ground connector may be formed of a conductive foil which flexes with thermal stress.

These and other advantages and features of the invention will be more readily understood from the following detailed description which is provided in connection with the accompanying drawings.

DETAILED DESCRIPTION OF PREFERRED EMBODIMENTS

Figure 1:
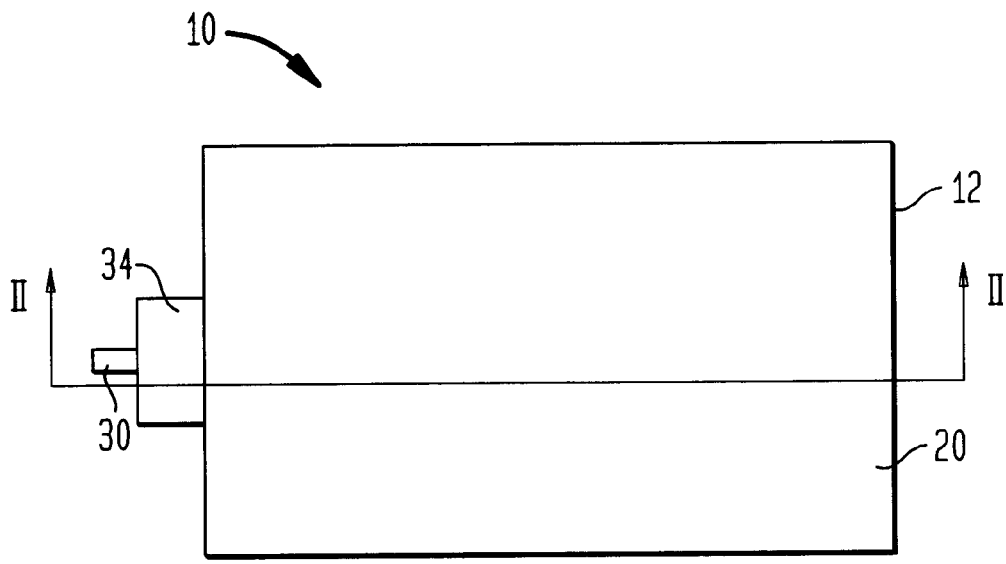
FIG. 1 is a top view of a semiconductor package constructed in accordance with an embodiment of the invention.
Figure 2:
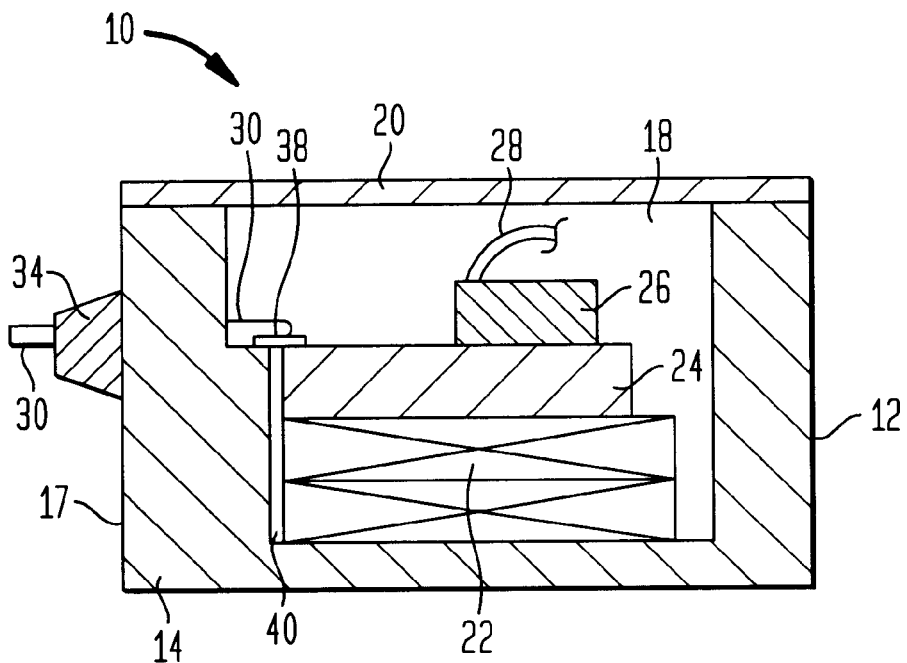
FIG. 2 is a cross-sectional view taken along line II—II of the semiconductor package of FIG. 1.
Figure 3:
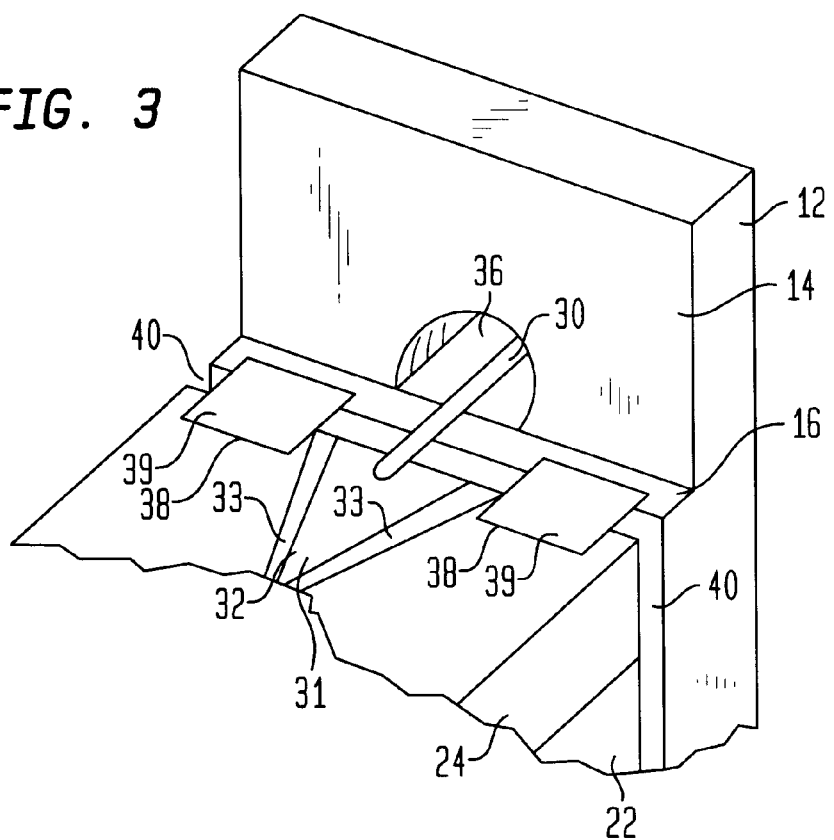
FIG. 3 is a perspective view of semiconductor components within the semiconductor package of FIG. 2.

Referring now to FIGS. 1–3, there is illustrated a semiconductor package 10 which includes a package body 12. The package body 12 includes an interior body wall 14 (FIG. 2), which acts as a ground for the package body 12, and a ledge 16 extending transversely from the wall 14. Held within a cavity 18 of the package body 12 are a conductive support structure 24, a semiconductor chip 26, an electrical connector 28, an assembly including an optical subassembly and a heat transfer device, such as a thermoelectric cooling (TEC) device, denoted generally as 22. Preferably, the chip 26 is a laser chip capable of emitting optical signals. A lid 20 closes the cavity 18.

A high speed optoelectric connector 30—such as a metallic (for example, gold) wire or pin, or a V connector, or a K connector—extends from within the cavity 18 out of the package body 12 through a channel 36 (FIG. 3) of a conduit 34 (FIG. 2) toward a telecommunications device (not shown). The conduit 34 is positioned on an external surface 17 of the package wall 14.

A waveguide 32 (FIG. 3) is located on an upper surface of the conductive support structure 24. The waveguide 32 has a signal plane 31 between a pair of ground planes 33. The waveguide 32 serves to transmit signals from the chip 26 to the high speed connector 30. The waveguide 32 may take any suitable waveguide form, but is preferably a coplanar waveguide, as illustrated. The conductive support structure 24 is preferably a submount formed of a conductive material, such as, for example, beryllium oxide.

The TEC device of the assembly 22 provides active temperature control based upon the dynamic characteristics of the chip 26. The optical performance output of an optoelectric chip, such as the chip 26, changes over time and with temperature variations. As an output signal of the chip 26 changes with time and temperature, the TEC device of the assembly 22 is able to place the optical output signal within desired specifications.

A gap 40 exists between the semiconductor components within the cavity 18, i.e., the structure 24 and the assembly 22, and the ledge 16 of the wall 14. At least one, and preferably two ground connectors 38 are positioned across the gap 40. The connectors 38 provide a physical connection with the ground connectors 33 of the structure 24, so as to provide a ground connection between the structure 24 and the package body 12. In a preferred embodiment of the invention, the ground connectors 38 are on opposite sides of the signal plane 31. The invention should not be limited, however, to the preferred embodiments shown and described in detail herein.

Figure 4:
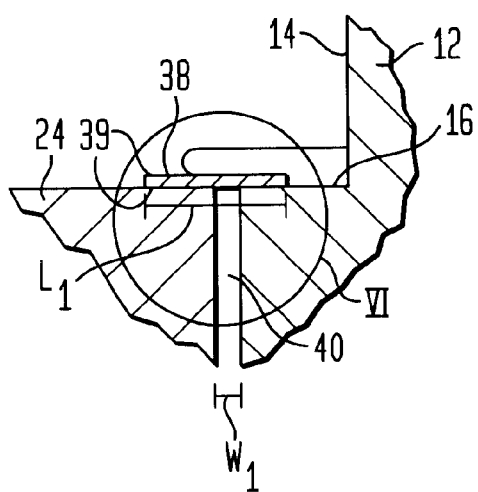
FIG. 4 is a partial cross-sectional view of a ground connector of the semiconductor package of FIG. 2.
Figure 5:
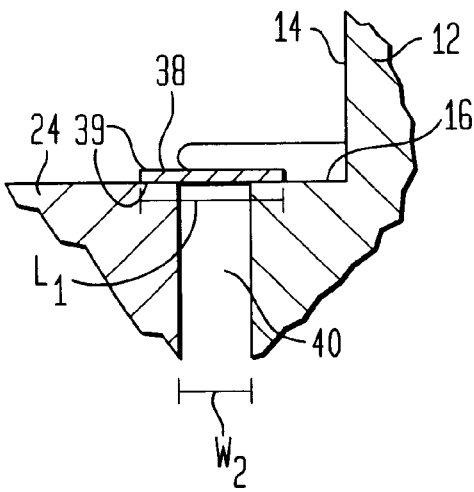
FIG. 5 is a partial cross-sectional view of a ground connector constructed in accordance with another embodiment of the invention.

In the embodiment shown in FIG. 4, the gap 40 has a width $W_1$ which is less than half as long as the length $L_1$ of the ground connectors 38. In the embodiment shown in FIG. 5, the gap 40 has a width $W_2$ which is at least half as long as the length $L_1$ of the the ground connectors 38. Most preferably, the gap 40 is less than 0.010 inches.

The ground connectors 38 are formed of a conductive material, preferably a metallic material. Most preferably, the ground connectors 38 are formed of a material which conducts electricity but is a poor thermal conductor, such as, for example, stainless steel. Stainless steel also inhibits thermal loss since it is a poor conductor of heat. Stainless steel foil also allows the ground connectors 38 to be more compliant, allowing greater flex due to thermal changes caused by the TEC device of the assembly 22. The TEC device of the assembly 22 causes thermal changes to the conductive support structure 24. Specifically, the TEC device of the assembly 22 causes the structure 24 to expand and shrink, thereby shortening and lengthening, respectively, the width $W_1$ of the gap 40.

In high speed applications, such as in optoelectric semiconductor devices, the electrical current travels close to the surfaces of the connection structures. In one aspect of the invention, the ground connectors 38 are plated with a highly electrically conductive material, such as a layer of gold 39. The plating 39 enhances the electrical conductivity of the ground connectors 38. Since the electrical current travels close to the surfaces of the connection structures, the plating 39 may be as thin as about 10 microns. Furthermore, since the plating 39 is relatively thin compared to the connector 38, thermal loss at the ground connectors 38 remains inhibited since the connectors 38 are primarily formed of stainless steel. The plating 39 may surround the ground connectors 38, or it may be on opposing sides of the ground connectors, on one side of the ground connectors, or it may be in selected portions, such as stripes, on the ground connectors.

Figure 6:
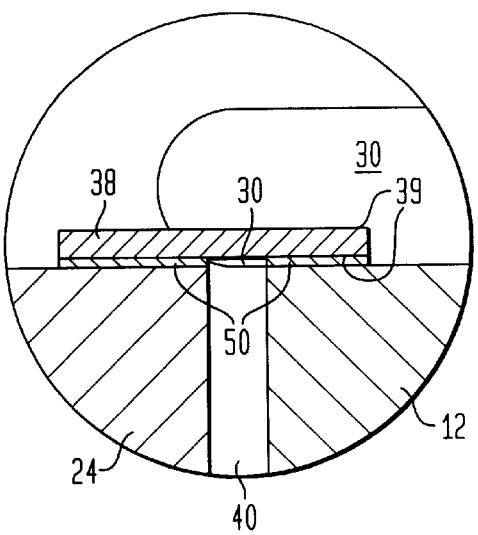
FIG. 6 is an enlarged view taken within circle VI of the ground connector of FIG. 4.
Figure 7:
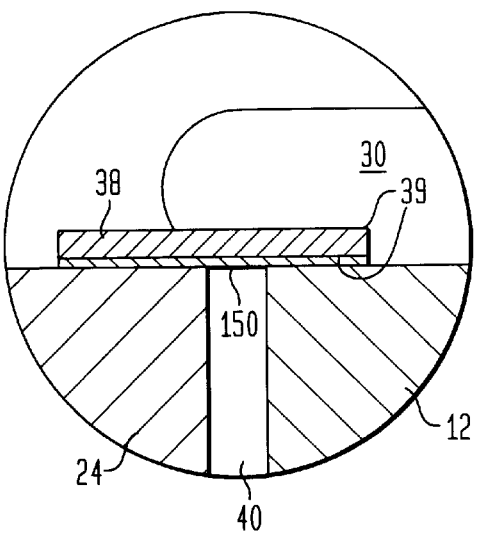
FIG. 7 is an enlarged view of a ground connector constructed in accordance with another embodiment of the invention.

The ground connectors 38 may be attached to the structure 24. In one aspect of the invention, the ground connectors 38 are attached to the structure 24 with a soft solder 50 (FIG. 6). In another aspect of the invention, the ground connectors 38 are attached to the structure 24 with a conductive epoxy 150 (FIG. 7).

Figure 8:
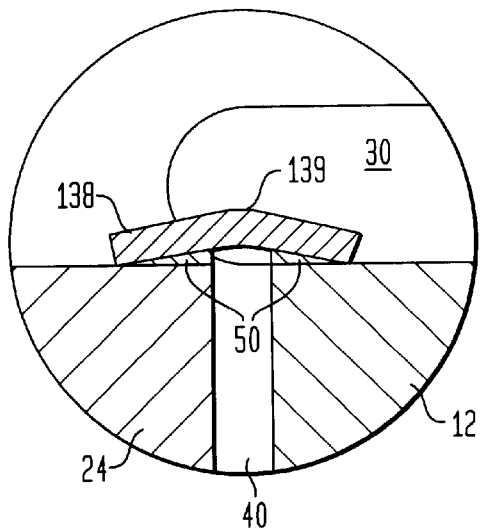
FIG. 8 is an enlarged view of a ground connector constructed in accordance with another embodiment of the invention.

As noted above, the ground connectors 38 are formed of a material, such as stainless steel, which allows for flex due to thermal changes caused by the TEC device of the assembly 22. In one aspect of the invention, as illustrated in FIG. 8, ground connectors 138 may be mounted across the gap 40 onto the package body 12 and the structure 24. The ground connectors 138 include a crease 139, which allows for flex of the ground connectors 138 in response to thermal changes caused by the TEC device of the assembly 22.

While the invention has been described in detail in connection with preferred embodiments known at the time, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Accordingly, the invention is not to be seen as limited by the foregoing description, but is only limited by the scope of the appended claims.

What is claimed as new and desired to be protected by Letters Patent of the United States is:

1. A semiconductor package, comprising:

a chip;

a conductive support structure including a coplanar waveguide;

a package body, said chip and conductive support structure being positioned within said package body;

a high speed connector extending from said package body; and at least one ground connector connecting said conductive support structure to said package body, said ground connector being formed of a metallic foil.

2. The semiconductor package of claim 1, wherein said package body includes:

an optical subassembly;

a heat transfer device; and a cavity, and wherein said chip, said conductive support structure, said optical subassembly, said heat transfer device, and said ground connector are located within said cavity.

3. The semiconductor device of claim 1, wherein said chip is electrically connected to said conductive support structure.

4. The semiconductor device of claim 1, wherein said package body includes a ledge.

5. The semiconductor device of claim 4, wherein a gap exists between said conductive support structure and said ledge.

6. The semiconductor device of claim 5, wherein said ground connector traverses said gap.

7. The semiconductor device of claim 6, wherein said ground connectors are adapted to flex as the width of said gap changes.

8. The semiconductor device of claim 1, further comprising a lid for enclosing said chip and conductive support structure within said package body.

9. A semiconductor package, comprising:

a laser light source;

a conductive support structure including a coplanar waveguide, said laser light source being positioned on said conductive support structure;

a package body; and a flexible connector for grounding said laser light source to said package body, wherein said flexible connector is formed of metallic foil.

10. The package of claim 9, further comprising an optical subassembly located in said package body.

11. A method for reducing thermal loss through ground connections in a high speed semiconductor package, comprising:

providing a chip and a conductive support structure including a coplanar waveguide within a cavity of a package body, said cavity including a wall having a ledge;

positioning at least one ground connector between said conductive support structure and said ledge, wherein said ground connector comprises stainless steel foil; and enclosing the chip and conductive support structure within the cavity with a lid.

12. The method of claim 11, wherein said conductive support structure is provided on a heat transfer device.

13. The method of claim 11, further comprising the step of providing a second ground connector between said support structure and said ledge.

14. A method for fabricating a semiconductor package having ground connectors adapted to be compliant under thermal stress, the method comprising:

providing a chip and a conductive support structure within a cavity of the semiconductor package, said cavity including an interior wall spaced apart from said conductive support structure;

attaching at least one ground connector to said conductive support structure and said cavity interior wall, said ground connector comprising a conductive foil; and enclosing the chip and conductive support structure within the cavity with a lid.

15. The method of claim 14, wherein said cavity interior wall includes a ledge, said ground connector being attached to said ledge.

16. A packaged assembly comprising:

a package body;

a conductive support structure for supporting a chip and including a coplanar waveguide;

a thermoelectric cooling device;

a flexible conductor for providing an electrical ground to said package body, and wherein said flexible conductor is formed of a foil formed of a low thermal conductivity material; and a lid for enclosing said conductive support structure and said thermoelectric cooling device within said package body.

17. The packaged assembly of claim 16, wherein said flexible conductor comprises a metallic foil.

18. The packaged assembly of claim 17, wherein said flexible conductor comprises stainless steel.

19. The packaged assembly of claim 18, further comprising a metallic plating on said flexible conductor.

* * * * *